US009680399B2

(12) United States Patent
Yamanaka et al.

(10) Patent No.: US 9,680,399 B2
(45) Date of Patent: Jun. 13, 2017

(54) LINEAR ULTRASONIC MOTOR AND LENS APPARATUS AND IMAGE PICKUP APPARATUS USING THE SAME

(71) Applicant: CANON KABUSHIKI KAISHA, Tokyo (JP)

(72) Inventors: Takumi Yamanaka, Tokyo (JP); Kazuhiro Noguchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/939,519

(22) Filed: Nov. 12, 2015

(65) Prior Publication Data
US 2016/0065092 A1 Mar. 3, 2016

Related U.S. Application Data

(62) Division of application No. 14/228,937, filed on Mar. 28, 2014, now Pat. No. 9,219,429.

(30) Foreign Application Priority Data

Apr. 1, 2013 (JP) ................................. 2013-076194
Mar. 20, 2014 (JP) ................................. 2014-058095

(51) Int. Cl.
*G02B 7/02* (2006.01)
*H02N 2/00* (2006.01)
(Continued)

(52) U.S. Cl.
CPC .............. *H02N 2/043* (2013.01); *G02B 7/04* (2013.01); *G02B 7/09* (2013.01); *G02B 7/10* (2013.01);
(Continued)

(58) Field of Classification Search
CPC ... G02B 7/02; G02B 7/04; G02B 7/08; G02B 7/09; G02B 7/10; G02B 7/102;
(Continued)

(56) References Cited

U.S. PATENT DOCUMENTS 5,416,375 A * 5/1995 Funakubo .............. H02N 2/026
310/317
5,644,440 A 7/1997 Akada
(Continued)

FOREIGN PATENT DOCUMENTS

CN 101325384 A 12/2008
CN 102017388 A 4/2011
(Continued)

OTHER PUBLICATIONS

Office Action in Japanese Patent Application No. 2014-058095, dated Mar. 17, 2015.
(Continued)

*Primary Examiner* — Loha Ben
(74) *Attorney, Agent, or Firm* — Fitzpatrick, Cella, Harper & Scinto

(57) ABSTRACT

A linear ultrasonic motor includes a vibrator having a piezoelectric element, a movable part applying a pressing force to the vibrator and bringing the vibrator into pressed contact with a base part, a cover part being fixed to the base part, a rolling part being rollably held between a movable guide part of the movable part and a cover guide part of the cover part, and a body to be driven having a transmission member that is pivotably supported and able to move only in the movable direction. The transmission member includes a bias part that abuts on a transmission part of the movable part and applies a biasing force of biasing the movable part to the rolling part to the transmission part. The rolling part is held by a resultant force of the pressing force or a reaction force of the pressing force, and the biasing force.

34 Claims, 9 Drawing Sheets

(51) Int. Cl.
*H01L 41/00* (2013.01)
*H02N 2/04* (2006.01)
*H02N 2/02* (2006.01)
*G02B 7/04* (2006.01)
*G02B 7/09* (2006.01)
*H01L 41/04* (2006.01)
*G02B 7/10* (2006.01)
*G02B 7/08* (2006.01)
*H01L 41/083* (2006.01)

(52) U.S. Cl.
CPC ............. *H01L 41/00* (2013.01); *H01L 41/04* (2013.01); *H02N 2/004* (2013.01); *H02N 2/006* (2013.01); *H02N 2/02* (2013.01); *H02N 2/026* (2013.01); *G02B 7/08* (2013.01); *H01L 41/042* (2013.01); *H01L 41/083* (2013.01); *H02N 2/001* (2013.01)

(58) Field of Classification Search
CPC .. G02B 27/0006; H02N 2/0005; H02N 2/001; H02N 2/004; H02N 2/006; H02N 2/02; H02N 2/026; H02N 2/0055; H02N 2/08; H01L 41/00; H01L 41/04; H01L 41/042; H01L 41/08; H01L 41/083; H01L 41/09; H01L 41/0913; B41J 2/14233; B41J 2002/1425; B41J 2002/14258
USPC .... 359/823–825, 694–704; 310/316.02, 317, 310/323.01–323.06, 323.14, 323.16, 310/323.17, 328, 345, 354–356, 363, 365, 310/366; 347/68, 70, 71; 348/335
See application file for complete search history.

(56) References Cited

U.S. PATENT DOCUMENTS

| | | | |
|---|---|---|---|
| 5,812,330 A | 9/1998 | Akada | |
| 5,982,075 A * | 11/1999 | Hayasaka | H02N 2/004 310/12.01 |
| 6,104,123 A | 8/2000 | Okazaki et al. | |
| 7,084,550 B2 | 8/2006 | Sasaki et al. | |
| 7,129,621 B2 * | 10/2006 | Sakano | G02B 7/102 310/323.01 |
| 7,230,366 B2 * | 6/2007 | Sasaki | G02B 7/102 310/323.17 |
| 7,502,553 B2 | 3/2009 | Sato et al. | |
| 7,696,670 B2 | 4/2010 | Sakamoto | |
| 7,834,517 B2 | 11/2010 | Sakamoto | |
| 8,063,537 B2 | 11/2011 | Sakamoto | |
| 8,164,637 B2 * | 4/2012 | Kawai | G03B 5/00 310/311 |
| 8,351,142 B2 * | 1/2013 | Hashi | G02B 7/08 359/823 |
| 9,397,586 B2 * | 7/2016 | Yamasaki | H02N 2/026 |
| 2014/0016014 A1 * | 1/2014 | Yokoyama | H02N 2/0015 348/335 |
| 2015/0200611 A1 * | 7/2015 | Yamamoto | H02N 2/08 310/323.03 |

FOREIGN PATENT DOCUMENTS

| | | |
|---|---|---|
| JP | 03-128683 A | 5/1991 |
| JP | 05-137359 A | 6/1993 |
| JP | 07-337047 A | 12/1995 |
| JP | 09-047044 A | 2/1997 |
| JP | 11-155290 A | 6/1999 |
| JP | 2005-099549 A | 4/2005 |
| JP | 2006-301453 A | 11/2006 |
| JP | 2006-301454 A | 11/2006 |
| JP | 2008-067479 A | 3/2008 |
| JP | 2008-220030 A | 9/2008 |
| JP | 2008-306907 A | 12/2008 |

OTHER PUBLICATIONS

Office Action issued in Chinese Patent Application No. 201410128640.0, dated Dec. 28, 2015.

* cited by examiner

LINEAR ULTRASONIC MOTOR AND LENS APPARATUS AND IMAGE PICKUP APPARATUS USING THE SAME

BACKGROUND OF THE INVENTION

Field of the Invention

The present invention relates to an ultrasonic motor, and particularly relates to a linear driving type of ultrasonic motor (hereafter referred to as linear ultrasonic motor).

Description of the Related Art

In a linear ultrasonic motor, conventionally, a high-frequency voltage is applied to a piezoelectric element, and thereby the piezoelectric element vibrates a fixed ultrasonic vibrator. The vibration of the ultrasonic vibrator drives a sliding member which is pressurized by the ultrasonic vibrator. Various ideas are considered for achieving a linear ultrasonic motor which can keep a high output even with a small size and enhances driving efficiency.

For instance, in a linear ultrasonic motor disclosed in Japanese Patent Application Laid-Open No. 2005-99549, a transmission unit between an ultrasonic vibrator and a member to be driven is arranged in a direction perpendicular to an optical axis, in other words, perpendicularly to a driving direction.

However, in the above described linear ultrasonic motor disclosed in Japanese Patent Application Laid-Open No. 2005-99549, it has been necessary to increase a pressurization force of a bias member against a vibrator, in order to prevent a follow-up delay in the driving direction. However, there has been a problem that when the pressurization force is excessively large, an equalizing property for a transmission member decreases.

An object of the present invention is to provide a linear ultrasonic motor which can efficiently transmit a driving force to a body to be driven.

SUMMARY OF THE INVENTION

The linear ultrasonic motor of the present invention has the following constitution.

A linear ultrasonic motor includes a vibrator, the vibrator having a piezoelectric element; a movable part, the movable part applying a pressurization force to the vibrator and bringing the vibrator into pressed contact with a base part; a cover part, the cover part being fixed to the base part; a rolling part being rollably held between a movable guide part of the movable part and a cover guide part of the cover part, the movable guide part extending in a movable direction and the cover guide part extending in the movable direction; and a body to be driven, the body to be driven having a transmission member that is pivotably supported and being able to move only in the movable direction. The transmission member includes a bias part that abuts on a transmission part of the movable part and applies a biasing force of biasing the movable part to the rolling part, to the transmission part. The rolling part is held by a resultant force of the pressurization force or a reaction force of the pressurization force, and the biasing force.

The present invention can provide a linear ultrasonic motor which can efficiently provide a driving force to a body to be driven.

Further features of the present invention will become apparent from the following description of exemplary embodiments with reference to the attached drawings.

DESCRIPTION OF THE EMBODIMENTS

Preferred exemplary embodiments of the present invention will now be described in detail in accordance with the accompanying drawings.

Incidentally, a linear ultrasonic motor which is utilized as an actuator that drives a lens barrel and the like of a digital camera will be described below, as an example. However, the application in which the present invention is used is not limited to this example.

In addition, in the present specification, the same member in the figure is designated by the same symbol, and a moving direction of a movable part which will be described later with respect to a base part is defined as an X-axis (movable direction), and a normal direction of a contact part of a vibration plate included in the movable part is defined as a Z-axis, in order to clarify the structure of the linear ultrasonic motor and the movement thereof. In addition, a direction perpendicular to both the X-axis and the Z-axis is defined as a Y-axis. The directions of the axes in each figure are illustrated in the figure, but are not limited to these directions.

Exemplary Embodiment 1

Figure 1:
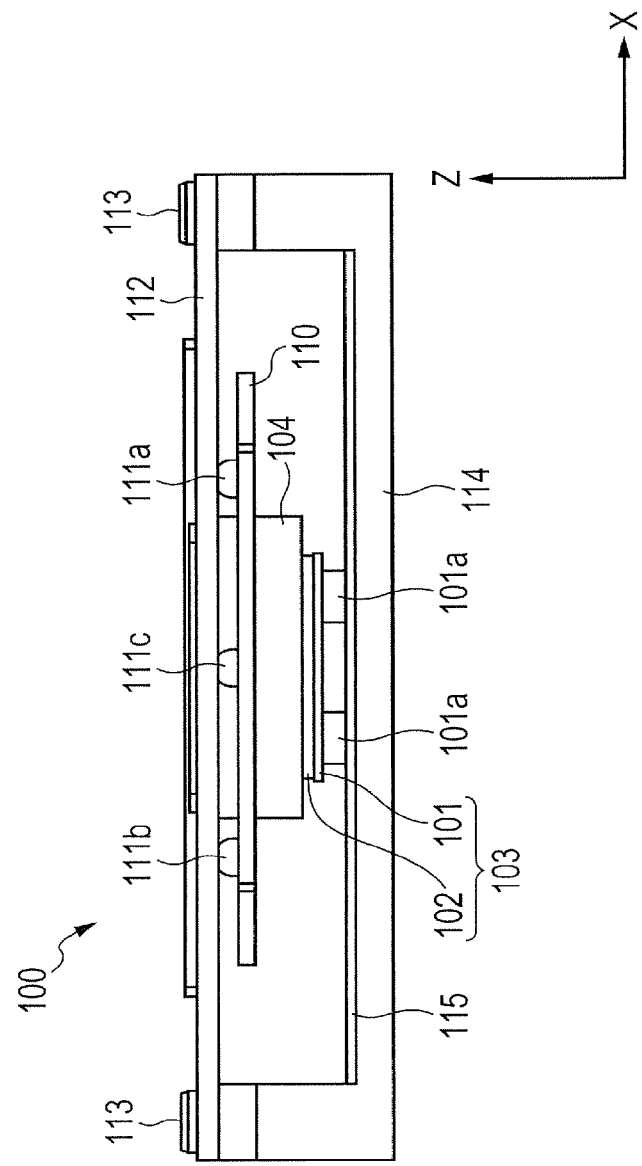
FIG. 1 is a side view of a linear ultrasonic motor according to a first exemplary embodiment of the present invention.

FIG. 1 is a side view of a linear ultrasonic motor 100 when viewed from the Y-axis direction, which is a first exemplary embodiment of the present invention, and the movable part is in a middle position.

Figure 2:
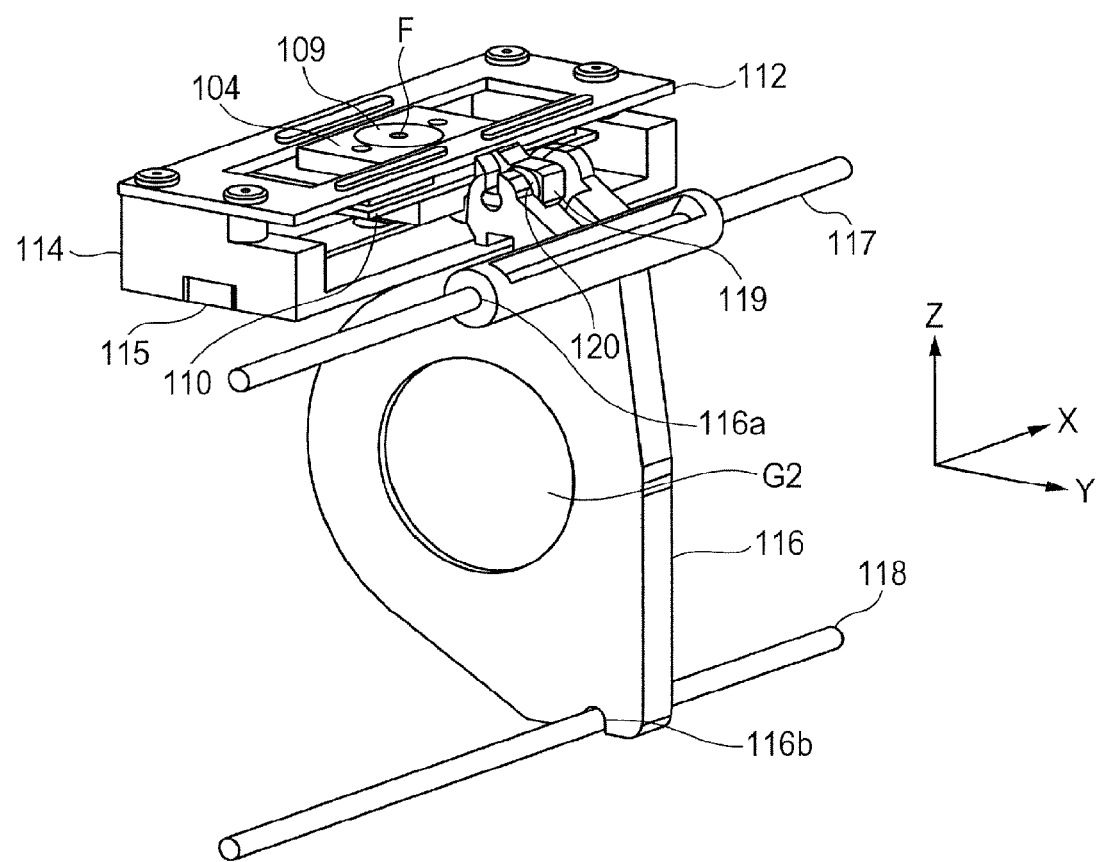
FIG. 2 is a perspective view of a linear ultrasonic motor to which a lens retention frame is connected, according to the first exemplary embodiment of the present invention.

FIG. 2 is a perspective view of the linear ultrasonic motor 100 to which a lens retention frame has been connected, and the movable part is in a middle position.

Figure 3:
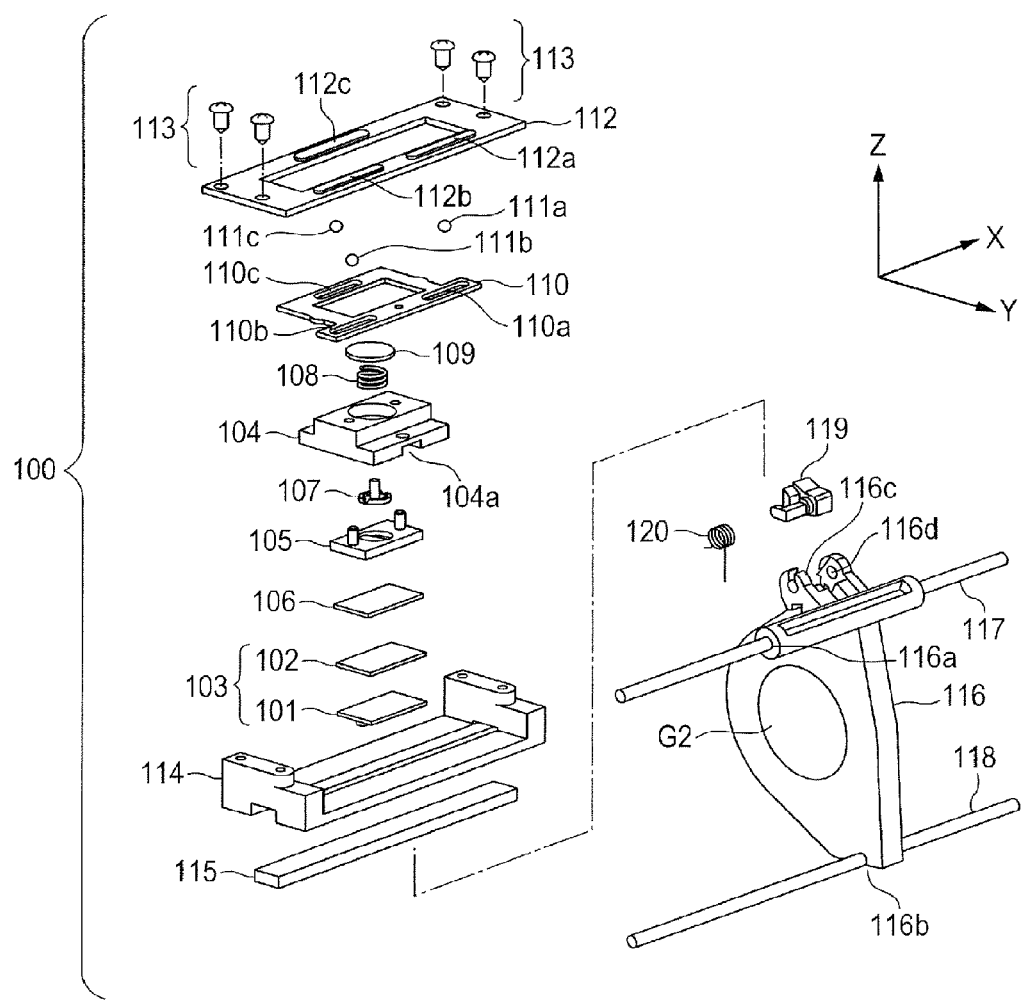
FIG. 3 is an exploded perspective view of the linear ultrasonic motor to which the lens retention frame is connected, according to the first exemplary embodiment of the present invention.

FIG. 3 is an exploded perspective view of the linear ultrasonic motor 100 to which the lens retention frame is connected.

Firstly, the structure of the linear ultrasonic motor 100 will be described below with reference to FIG. 1, FIG. 2 and FIG. 3.

The linear ultrasonic motor 100 in the present exemplary embodiment has a longitudinal axis in an X-axis direction, and is formed of each member which will be described below. A vibration plate 101 has a piezoelectric element 102 fixed thereon by a well-known adhesive or the like, and the piezoelectric element 102 excites a vibrator 103 by voltage applied thereto. Incidentally, a method for bonding the vibration plate 101 to the piezoelectric element 102 is not limited as long as the vibration plate 101 is bonded to the piezoelectric element 102. The vibration plate 101 further includes a contact part 101a, and the contact part 101a comes in contact with a contact base member 115 which will be described later, under a pressurized contact condition that entails pressurization. The vibrator 103 is formed of the vibration plate 101 and the piezoelectric element 102. When an AC voltage is applied to the piezoelectric element 102 in a state in which the vibration plate 101 and the piezoelectric element 102 are bonded to each other, a resonance phenomenon occurs in each of a longitudinal direction and a transverse direction of the vibrator 103. As a result, ellipsoidal motion occurs in the contact part 101a of the vibration plate 101. A direction of rotation and an ellipse ratio of the ellipsoidal motion are appropriately changed by changing a frequency and a phase of the voltage which is applied to the piezoelectric element 102, and thus a desired movement can be obtained.

A vibrator support member 104 has a convex shape in the Z-axis direction of a YZ cross section, and includes a through hole for receiving a spring 108 and a spring retention member 107 therein, and a transmission part 104a that is engaged with a pivot member 119 which will be described later. The spring retention member 107 has a face for receiving and holding one end of the spring 108, and the back side of the face comes in surface contact with a pressurization plate 105. The other end of the spring comes in contact with a spring keep plate 109, and the spring keep plate 109 can be fitted into the through hole of the vibrator support member 104. In the through hole, the spring 108 is held by the spring retention member 107, and is interposed between the pressurization plate 105 and the spring keep plate 109. Thereby, the spring 108 can freely expand and contract, and applies a pressurization force to the Z-axis direction. In addition, the pressurization plate 105 has two projecting portions on a face of a side which receives the spring retention member 107, in a direction parallel to the normal line of the face. The two projecting portions are received by the holes which are provided on the vibrator support member 104, respectively. The movement to a direction other than the Z-axis direction is limited by this structure, and the pressurization force is efficiently transmitted to other members. In the present exemplary embodiment, the pressurization plate 105, the spring retention member 107, the spring 108 and the spring keep plate 109 constitute a pressurization member, and the centers of gravity of each component can be connected by a straight line parallel to the Z-axis.

An elastic member 106 is arranged between the piezoelectric element 102 and the pressurization plate 105.

A moving plate 110 has a fitting hole having an approximately rectangular shape and three movable guide parts 110a, 110b and 110c of V-shaped grooves, and the projecting portion of the vibrator support member 104 is fitted into the fitting hole of the moving plate 110. The movable guide parts 110a, 110b and 110c of the V-shaped grooves extend with a predetermined length in the X-axis direction.

On the other hand, a cover plate 112 which functions as a cover member also has a hole having an approximately rectangular shape and three cover guide parts 112a, 112b and 112c of V-shaped grooves that extend with a predetermined length in the X-axis direction, and a projecting portion of the vibrator support member 104 is fitted into the hole. Spherical rolling members (rolling balls) 111a, 111b and 111c which correspond to a rolling part is are rollably interposed between the cover guide parts 112a, 112b and 112c of the V-shaped grooves and the movable guide parts 110a, 110b and 110c of the V-shaped grooves, which correspond to the cover guide parts, respectively. Thus, the movable guide part provided in the moving plate of the movable part, the cover guide part provided in the cover plate of the base part, and the rolling part rollably interposed between these guide parts constitute a guide mechanism. Incidentally, the shape of the movable guide parts 110a, 110b and 110c and the cover guide parts 112a, 112b and 112c is not limited to the V-shaped groove, and may be another shape as long as the rolling part can be rollably interposed between the movable guide part and the cover guide part. The vibrator support member 104 and the moving plate 110 are structured so as to be capable of relatively moving in the X-axis direction with respect to the cover plate 112, without causing rattle.

The linear ultrasonic motor 100 further includes a base member 114. The base member 114 has a concave shape on an XZ plane, and has side walls in both sides of the X-axis and a fixed part formed of one part thereof. The fixed part has screw holes, which face the screw holes of the cover plate 112, respectively. The cover plate and the base member 114 are fixed to each other by a screw 113, but a fixing method is not limited as long as the cover plate and the base member are fixed to each other. In addition, the contact base member 115 is fixed to the bottom face part of the base member 114 from the lower side of the Z-axis by a not-shown screw or the like. The contact base member 115 comes in contact with the contact part 101a of the vibration plate 101, and the ellipsoidal motion which is generated in the vibrator 103 is converted into a driving force of the movable part by the friction therebetween. The movable part can move forward and backward in the X-axis direction by the driving force. Incidentally, a method for fixing the base member 114 to the contact base member 115 is not limited as long as the base member is fixed to the contact base member. In the present exemplary embodiment, the movable part is formed of the vibrator 103, the elastic member 106, the pressurization plate 105, the vibrator support member 104, the spring retention member 107, the spring 108, the spring keep plate 109 and the moving plate 110. In addition, a base part is formed of the cover plate 112, the screw 113, the base member 114 and the contact base member 115.

Hereinafter, the pressurization force which is generated in the pressurization member will be described below. The spring 108 applies the pressurization force to the pressurization plate 105 through the spring retention member 107. The pressurization force further pressurizes the vibrator 103 to the contact base member 115 through the elastic member 106, and the vibrator 103 is pressed against the contact base member 115. The contact part 101a of the vibration plate 101 comes in contact with the contact base member 115 in a state of being pressurized against the contact base member. On the other hand, a reaction force of the pressurization force caused by the contact base member 115 is received by the cover plate 112 through the rolling part. When the voltage is applied to the piezoelectric element 102 under this pressurized contact condition, the resonances in each of the X-axis direction and the Y-axis direction occur in the vibrator 103, and the tip of the contact part 101a causes the ellipsoidal motion. As a result, the movable part can move forward and backward in the X-axis direction.

Hereinafter, the connection between the ultrasonic motor 100 and the lens retention frame which holds an optical lens will be described below.

In FIG. 2 and FIG. 3, a lens G2 is fixed to a lens retention frame 116 which functions as a body to be driven, and the lens retention frame 116 constitutes a part of the lens unit of a digital camera or the like. The lens retention frame 116 has a fitting hole 116a into which a guide bar 117 is relatively slidably and freely fitted. In addition, an engaging part 116b is relatively slidably and freely engaged with a steady brace bar 118, which prevents the rotation of the lens retention frame 116 around the guide bar 117. The lens retention frame 116 further has a pivot member holding part 116c formed therein which is engaged with a pivot member and functions as a pivotably movable transmission member, and a well-known pivot member 119 is incorporated therein. A compressive torsion spring 120 which is a bias member is further incorporated into the pivot member 119. Due to the action of the incorporated compressive torsion spring 120, a rotative force in a clockwise direction with respect to the X-axis is applied to the lens retention frame 116 through the pivot member 119. Furthermore, the pivot member 119 is supported by an engaging hole 116d of the lens retention frame 116 while pressurizing the fitting hole to absorb the rattle of the movable part, and the pivot member 119 can be moved forward and backward in the X-axis direction integrally with the lens retention frame.

Figure 4A:
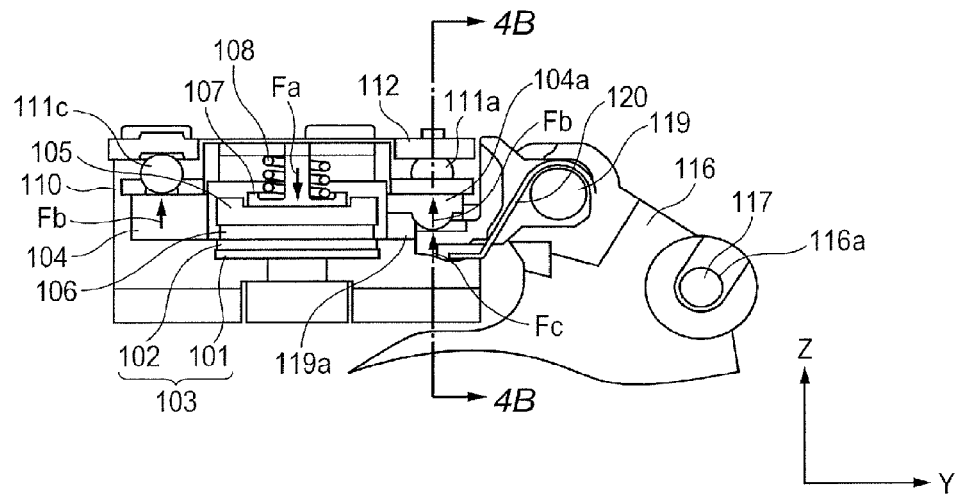
FIG. 4A is a sectional view of an essential part of the linear ultrasonic motor to which the lens retention frame is connected, according to the first exemplary embodiment of the present invention.
Figure 4B:
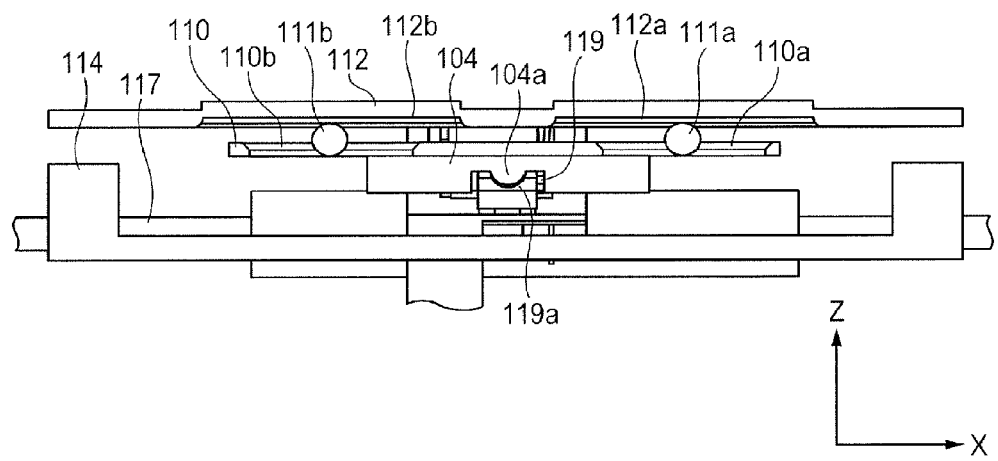
FIG. 4B is a sectional view of an essential part of the linear ultrasonic motor to which the lens retention frame is connected, according to the first exemplary embodiment of the present invention.

FIG. 4A and FIG. 4B are sectional views of an essential part of the linear ultrasonic motor to which the lens retention frame is connected; FIG. 4A illustrates a YZ cross section including the center of the spring 108 in FIG. 2; and FIG. 4B illustrates the sectional view taken along the line 4B-4B in FIG. 4A.

In an incorporated state, an engaging part 119a of the V-shaped groove which is a concave portion provided in the pivot member 119 is incorporated into the linear ultrasonic motor so as to be engaged with the transmission part 104a which is integrally formed in the vibrator support member 104 and has a convex shape with a spherical surface shape, and the transmission part 104a with the spherical surface shape and the engaging part 119a of the V-shaped groove form a point contact (partial contact), because both the parts are engaged with each other. Thus, the transmission mechanism in the present exemplary embodiment, which transmits the driving force of the linear ultrasonic motor to the lens retention frame of the body to be driven, has a structure for biasing the transmission member including the pivot member against the transmission part provided in the movable part by the bias member to make the members engaged with each other by the friction. Incidentally, the shape of the engaging part 119a is not limited to the V-shaped groove, and may be another shape as long as the engaging part 119a forms the above described point contact. In addition, in the above description, a structure has been described in which the transmission part with the convex shape is engaged with the engaging part with the concave shape of the transmission member, but the engaging part of the transmission member with the convex shape can also be structured so as to be engaged with the transmission part with the concave shape. Each of the linear ultrasonic motor 100, the guide bar 117 and the steady brace bar 118 is fixed to a not-shown lens barrel base member.

In addition, the spring 108 pressurizes the pressurization plate 105 through the spring retention member 107. This pressurization force biases the vibrator 103 against the contact base member 115 through the elastic member 106 (Fa in the figure).

A reaction force Fb of the pressurization force Fa is transmitted to the rolling part from the vibrator support member 104 through the moving plate 110. The rolling part is interposed between the moving plate 110 and the cover plate 112. Here, when the value of the reaction force Fb is large, a frictional force generated when the vibrator support member 104 is driven in the X-axis direction results in being large. However, in the present exemplary embodiment, the rolling part is interposed between the V-shaped grooves, the vibrator support member 104 is held so as to be guided straight, and there is no sliding part, which reduces a driving loss of the movable part.

In addition, the compressive torsion spring 120 biases the pivot member 119 against the transmission part 104a which is formed integrally with the vibrator support member 104 (Fc in the figure). The vibrator support member 104 and the pivot member 119 are held by friction due to this pressurization force, and the driving force of the movable part to the X-axis direction is transmitted to the lens retention frame 116.

On the other hand, there is the case where an error occurs between the accuracy in guiding the movable part straight in the X-axis direction and the accuracy in guiding the lens retention frame 116 straight. At this time, an equalizing mechanism becomes necessary which equalizes the errors of the accuracies in straight-ahead guiding between the transmission part 104a and the pivot member 119. On the other hand, in the present exemplary embodiment, the pivot member 119 has the engaging part 119a which has a V groove shape, and holds the transmission part 104a without causing rattle in the X-axis direction. In addition, in the Y-axis direction in the figure, the pivot member 119 is formed so as to have an aperture-shaped part. In addition, it is necessary to slide the transmission part 104a and the pivot member 119 by low friction, in order to prevent wrenching between the vibrator support member 104 and the lens retention frame 116. Because of this, the pivot member 119 is desirably molded from a high-sliding material such as POM (polyacetal). In addition, it is desirable to subject the surface of the transmission part 104a to mirror finish to lower sliding resistance, or to fix a hard ball which is made of ceramic, stainless steel, brass, tungsten carbide, carbon steel or the like, with an adhesive or the like.

In the present constitution, a biasing direction (Fc) of the compressive torsion spring 120 to the transmission part 104a is the same direction as the reaction force Fb of the pressurization force Fa of the spring 108 (that is, the opposite direction to the pressurization direction). In other words, the biasing force of the rolling part to the cover plate 112 becomes a resultant force of Fb and Fc. Because of this, the rattle of the movable part is reduced, and the straight-ahead stability of the movable part to the X-axis direction is enhanced. In other words, both the biasing force Fc due to the compressive torsion spring 120 and the pressurization force Fa against the vibrator 103 have stronger forces in the direction perpendicular to the movable direction than in the movable direction (X-axis direction), and the biasing force Fc due to the compressive torsion spring 120 has a stronger force in the pressurization direction against the vibrator 103 than in the direction perpendicular to the pressurization direction (Z-axis direction).

In addition, the transmission part 104a, the movable guide part of the V-shaped groove in the moving plate 110, and the cover guide part having the V-shaped groove of the cover plate 112, are arranged on the Z-axis so as to coincide with the others. In other words, the rolling part and the transmission part are arranged so as to match in the Z-axis direction when being projected onto a YZ plane, or the rolling part and the transmission part are arranged so as to be arrayed in a moving direction (X-axis direction) of the movable part. Due to the present arrangement, a moment disadvantageous and unnecessary for the straight-ahead stability of the vibrator support member 104 does not occur, which can enhance a transmission efficiency of the driving force.

As described above, the present exemplary embodiment enables the linear ultrasonic motor to efficiently provide the driving force even when the pressurization force of the vibrator is increased.

Figure 5:
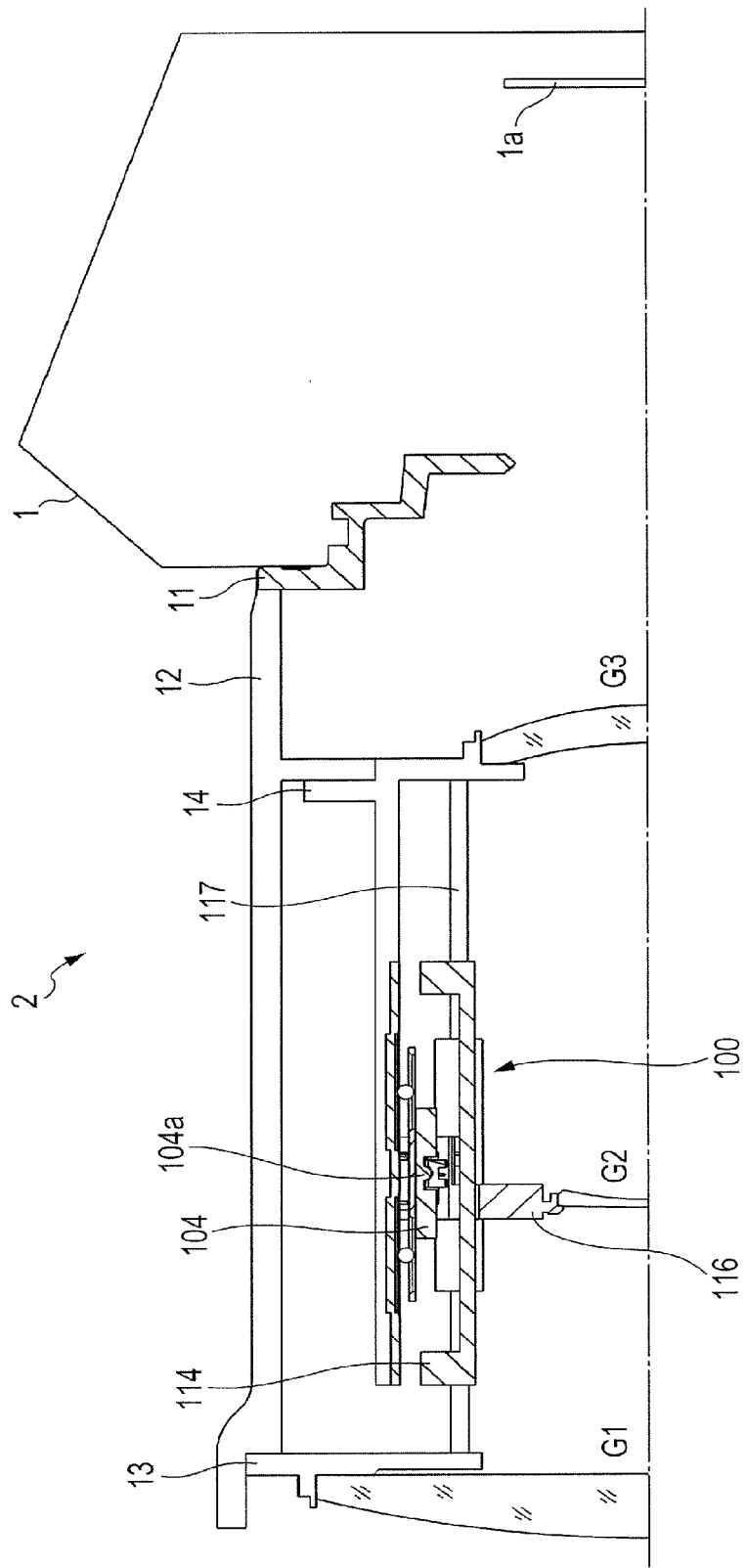
FIG. 5 is a sectional view of a lens barrel which has a linear ultrasonic motor mounted thereon according to the first exemplary embodiment of the present invention.

FIG. 5 illustrates a lens barrel, as one example of a lens apparatus into which a linear ultrasonic motor 100 of the present invention is incorporated.

Incidentally, because the lens barrel has a shape of approximately rotational symmetry, only the upper half is illustrated.

A lens barrel 2 is detachably mounted on a camera body 1 of an image pickup apparatus, and an imaging device 1a is provided in the camera body 1. A mount 11 of the camera body 1 has a bayonet part for mounting the lens barrel 2 on the camera body 1. The lens barrel 2 has a fixing cylinder 12, and abuts on a flange part of the mount 11. The fixing cylinder 12 and the mount 11 are fixed by a not-shown screw. Furthermore, a front lens barrel 13 for holding a lens G1 and a rear lens barrel 14 for holding a lens G3 are fixed to the fixing cylinder 12. The lens barrel 2 further includes a focal lens retention frame 116 which holds a lens G2. The focal lens retention frame 116 is further held by the guide bar 117 which is held by the front lens barrel 13 and the rear lens barrel 14, so as to be capable of moving straight. A not-shown flange part is formed on the base member 114 of the ultrasonic motor 100, and is fixed to the rear lens barrel 14 by a screw or the like.

When the movable part including the vibrator support member 104 of the ultrasonic motor 100 is driven in the above described structure, the driving force of the ultrasonic motor 100 is transmitted to the lens retention frame 116 through the vibrator support member 104. The lens retention frame 116 is guided by the guide bar 117 to linearly move.

Exemplary Embodiment 2

Figure 6:
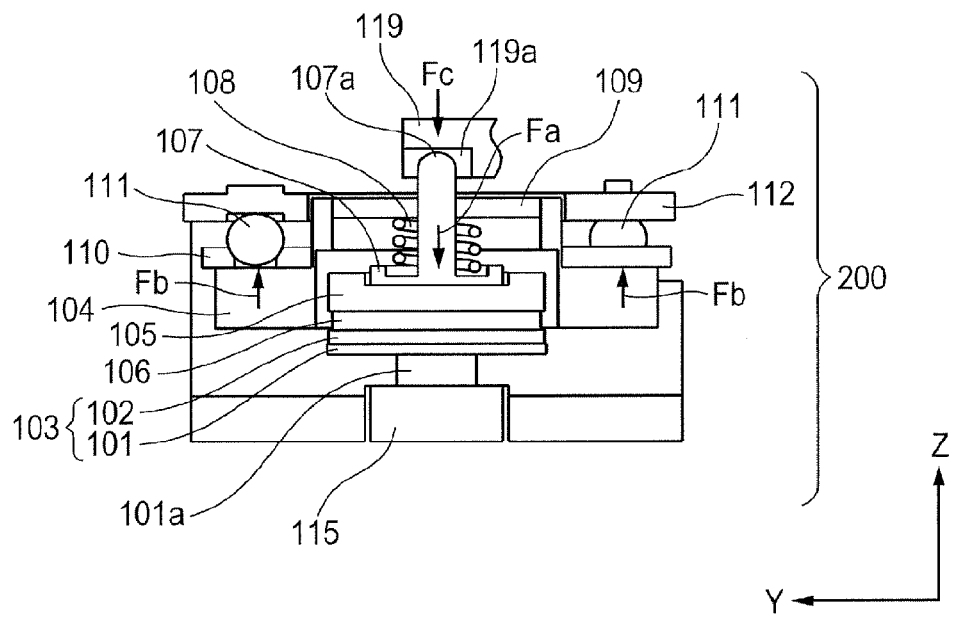
FIG. 6 is a sectional view of an essential part of a linear ultrasonic motor which is a second exemplary embodiment of the present invention.

FIG. 6 is a sectional view of an essential part of a linear ultrasonic motor which is a second exemplary embodiment of the present invention. The reference numerals of members having functions which overlap with those in the first exemplary embodiment shall be common in the present figure. In addition, the descriptions concerning contents of which the structures and functions are common with those in the first exemplary embodiment will be omitted.

In the first exemplary embodiment, the transmission part provided on the vibrator support member 104 and the pivot member 119 are structured so as to be engaged with each other. On the other hand, the present exemplary embodiment is structured so that the transmission part 107a of the spring retention member 107, which penetrates through the spring keep plate and extends to the outside, is provided in the spring retention member 107, and the pivot member 119 is engaged with the transmission part 107a of the spring retention member 107, in the extending end. As for the detail, in the state in which the linear ultrasonic motor 200 is incorporated into a not-shown lens barrel, the engaging part 119a of the V-shaped groove in the pivot member 119 which is held by the lens barrel is incorporated into the linear ultrasonic motor so as to be engaged with the transmission part 107a that is formed integrally with the spring retention member 107 and has a spherical surface shape. The transmission part 107a of the spring retention member 107, which has the convex shape with the spherical surface shape, is engaged with the engaging part 119a of the V-shaped groove, which is a concave portion, provided in the pivot member 119, and thereby both the parts form a point contact (partial contact). Incidentally, the shape of the engaging part 119a is not limited to the V-shaped groove, and may be another shape as long as the above described point contact is formed.

The spring 108 pressurizes the pressurization plate 105 through the spring retention member 107. This pressurization force biases the vibrator 103 against the contact base member 115 through the elastic member 106 (Fa in the figure).

The reaction force Fb of the pressurization force Fa is transmitted to the rolling members (rolling balls) 111 which correspond to a rolling part from the vibrator support member 104 through the moving plate 110. The rolling part is interposed between the respective guide parts of the moving plate 110 and the cover plate 112.

A not-shown compressive torsion spring biases the pivot member 119 against the transmission part 107a which is formed integrally with the spring retention member 107 (Fc in the figure). The spring retention member 107 and the pivot member 119 are held by friction due to this pressurization force, and the driving force of the movable part to the X-axis direction is transmitted to a not-shown lens retention frame.

In the present structure, a biasing direction (Fc) of the not-shown compressive torsion spring to the transmission part 107a is the same direction as the pressurization force Fa of the spring 108 (that is, the pressurization direction). In other words, the biasing force of the torsion spring exists on the same axis line as the pressurization force Fa. Accordingly, the pressurization force to the pressurization plate 105 becomes a resultant force of Fa and Fc. Here, when a necessary pressurization force to the pressurization plate 105 can be obtained only by the pressurization force Fc, the spring 108 may be eliminated from the structure. Here, the biasing force Fb of the rolling part against the cover plate 112 becomes a reaction force of a resultant force of the pressurization forces Fa and Fc. Here, the engaging part 119a of the V-shaped groove in the pivot member 119, the transmission part 107a of the spring retention member 107 and the contact part 101a of the vibration plate 101 are arranged on the Z-axis so as to coincide with the others in a projection onto the YZ plane. Alternatively, the transmission part 107a and the contact part 101a are arranged so as to be arrayed or match in the moving direction of the movable part. In other words, a thrust generating part which generates an ellipsoidal motion and the transmission part which transmits the driving force are arranged so as to match in an XZ plane, which accordingly can efficiently transmit a thrust of the movable body. In other words, both the biasing force Fc due to the compressive torsion spring and the pressurization force Fa against the vibrator 103 have stronger forces in the direction perpendicular to the movable direction than in the movable direction (X-axis direction), and the biasing force Fc due to the compressive torsion spring has a stronger force in the pressurization direction against the vibrator 103 than in the direction perpendicular to the pressurization direction (Z-axis direction).

Exemplary Embodiment 3

Figure 7:
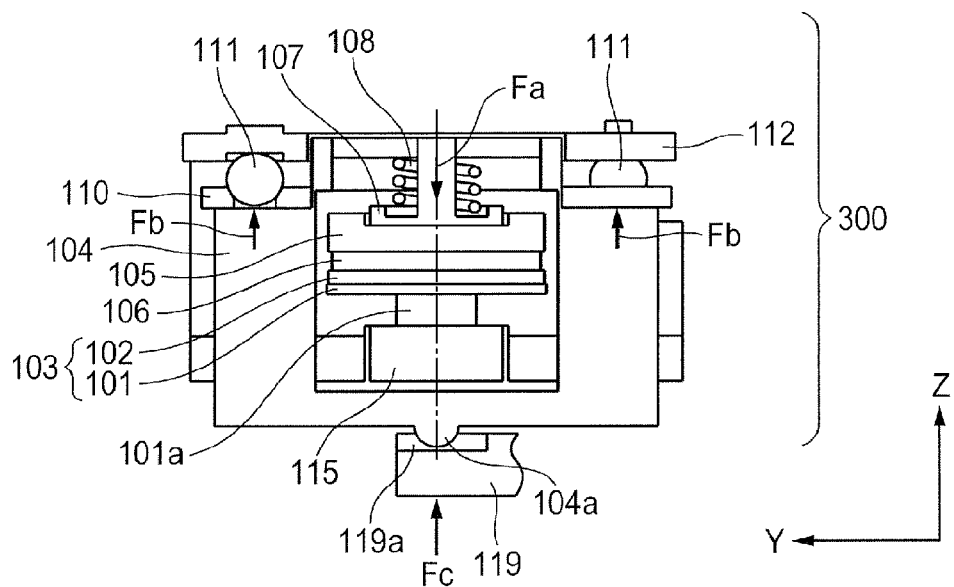
FIG. 7 is a sectional view of an essential part of a linear ultrasonic motor which is a third exemplary embodiment of the present invention.

FIG. 7 is a sectional view of an essential part of a linear ultrasonic motor which is a third exemplary embodiment of the present invention. The reference numerals of members having functions which overlap with those in the first exemplary embodiment shall be common in the present figure. In addition, the descriptions concerning contents of which the structures and functions are common with those in the first exemplary embodiment will be omitted.

In the first exemplary embodiment, the vibrator support member 104 and the pivot member 119 have been structured so as to be engaged with each other on the side face portion of the vibrator support member 104. In contrast, in the structure of the linear ultrasonic motor 300 according to the embodiment, only the arrangement of the transmission part 104a is different that is formed integrally with the vibrator support member 104 of the linear ultrasonic motor 100 and has a spherical surface shape, which has been described in the first exemplary embodiment. Specifically, in the present exemplary embodiment, the vibrator support member 104 and the pivot member 119 are structured so as to be engaged with each other on the bottom face portion of the vibrator support member 104.

In the present structure, a biasing direction (Fc) of a not-shown compressive torsion spring to the transmission part 104a is the same direction as the reaction force Fb of the pressurization force Fa of the spring 108 (that is, the opposite direction to the pressurization direction). In other words, the biasing force of the rolling part including the rolling members (rolling balls) 111a, 111b and 111c to the cover plate 112 becomes a resultant force of Fb and Fc. Because of this, the rattle of the movable part is reduced, and the straight-ahead stability of the movable part to the X-axis direction is enhanced. Furthermore, the engaging part 119a of the V-shaped groove in the pivot member 119, the transmission part 104a of the vibrator support member 104 and the contact part 101a of the vibration plate 101 are arranged so as to be arrayed or match in the advancing direction of the movable part. In other words, a thrust generating part (contact part) which generates an ellipsoidal motion and the transmission part are arranged so as to match in the XZ plane, which accordingly can efficiently transmit a thrust of the movable body. In other words, both the biasing force Fc due to the compressive torsion spring and the pressurization force Fa against the vibrator 103 have stronger forces in the direction perpendicular to the movable direction than in the movable direction (X-axis direction), and the biasing force Fc due to the compressive torsion spring has a stronger force in the pressurization direction against the vibrator 103 than in the direction perpendicular to the pressurization direction (Z-axis direction).

Exemplary Embodiment 4

Figure 8:
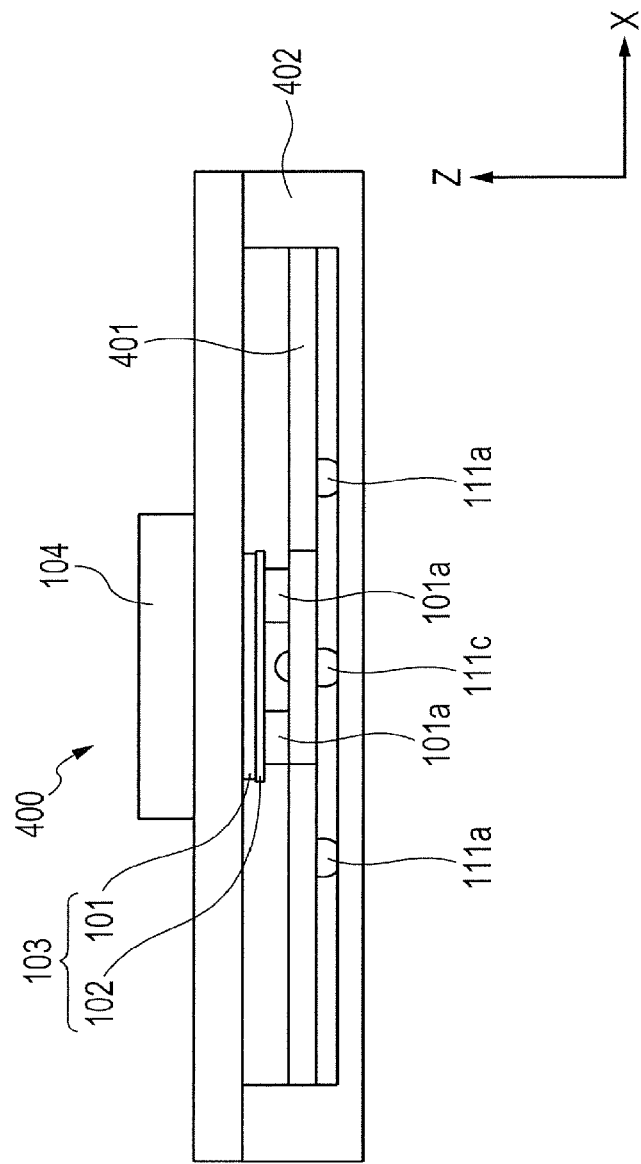
FIG. 8 is a side view of a linear ultrasonic motor according to a fourth exemplary embodiment of the present invention.

FIG. 8 is a side view of a linear ultrasonic motor 400 when viewed from a Y-axis direction, which is a fourth exemplary embodiment of the present invention, and a movable part is in a middle position.

Figure 9:
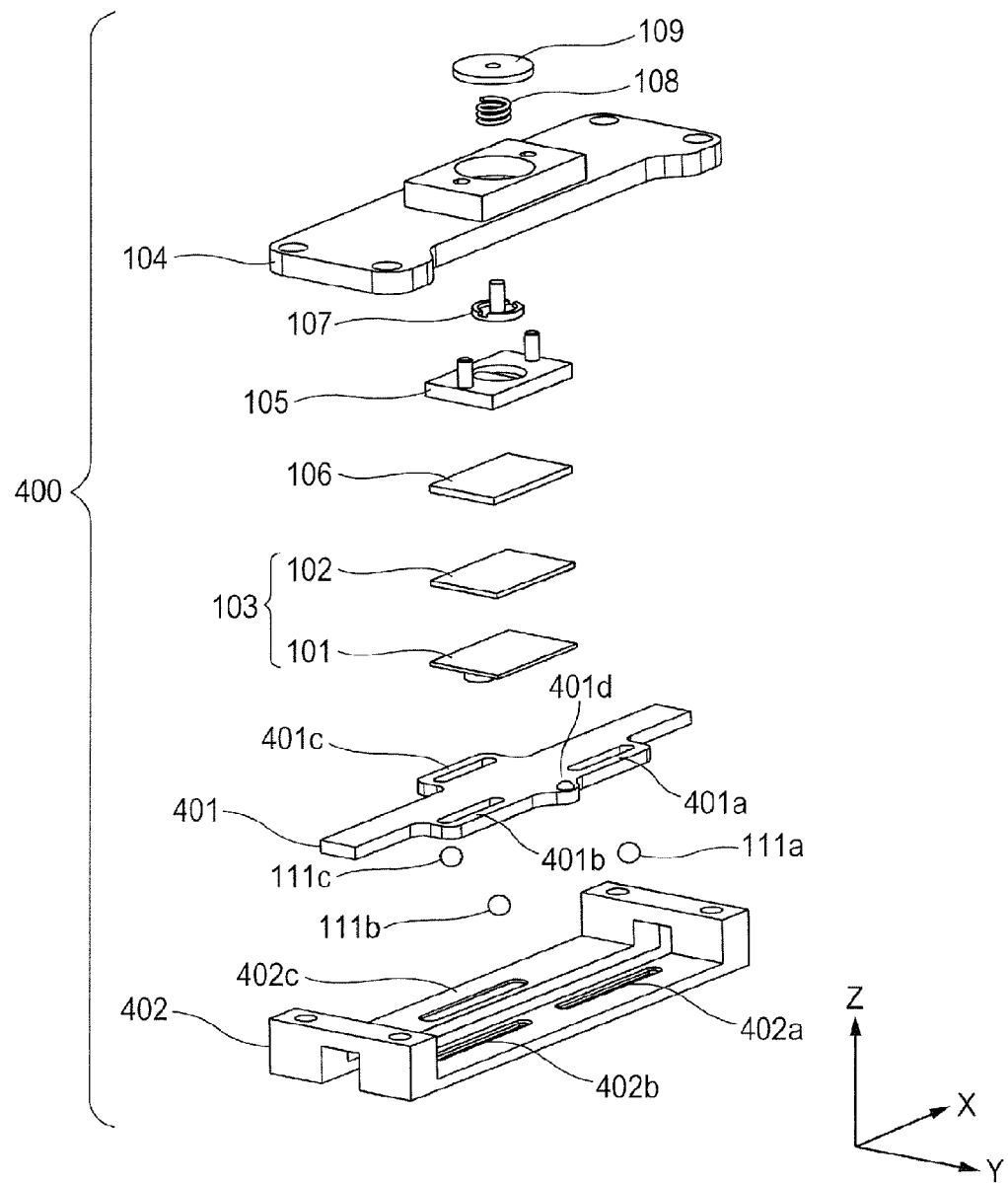
FIG. 9 is an exploded perspective view of the linear ultrasonic motor according to the fourth exemplary embodiment of the present invention.

FIG. 9 illustrates an exploded perspective view of the linear ultrasonic motor.

Firstly, the structure of the linear ultrasonic motor 400 of the present exemplary embodiment will be described below with reference to FIG. 8 and FIG. 9. Incidentally, the reference numerals of members having functions which overlap with those in the first exemplary embodiment shall be common in the present figure. In addition, the descriptions concerning contents of which the structures and functions are common with those in the first exemplary embodiment will be omitted.

The linear ultrasonic motor 400 in the present exemplary embodiment has a longitudinal axis in an X-axis direction, and is formed of each member which will be described below. The vibration plate 101 has the piezoelectric element 102 fixed thereon by a well-known adhesive or the like. The vibration plate 101 further includes a contact part 101a, and the contact part 101a comes in contact with a straight-ahead moving plate 401 which will be described later, under a pressurized contact condition that entails pressurization. The vibrator 103 is formed of the vibration plate 101 and the piezoelectric element 102.

A vibrator support member 104 has a convex shape in the Z-axis direction of a YZ cross section, and includes a through hole for receiving a spring 108 and a spring retention member 107 therein. The spring retention member 107 has a face for receiving and holding one end of the spring 108, and the back side of the face comes in surface contact with the pressurization plate 105. The other end of the spring comes in contact with a spring keep plate 109, and the spring keep plate 109 can be fitted into the through hole of the vibrator support member 104. In the through hole, the spring 108 is held by the spring retention member 107, and is interposed between the pressurization plate 105 and the spring keep plate 109. Thereby, the spring 108 can freely expand and contract, and applies a pressurization force to the Z-axis direction. In addition, the pressurization plate 105 has two projecting portions on a face of a side which receives the spring retention member 107, in a direction parallel to the normal direction of the face. The two projecting portions are received in the holes provided in the vibrator support member 104, respectively. The movement to directions other than the Z-axis direction is limited by this structure, and the pressurization force is efficiently transmitted to other members. In the present exemplary embodiment, the pressurization plate 105, the spring retention member 107, the spring 108 and the spring keep plate 109 constitute a pressurization member, and the centers of gravity of each component can be connected by a straight line parallel to the Z-axis.

An elastic member 106 is arranged between the piezoelectric element 102 and the pressurization plate 105.

The straight-ahead moving plate 401 includes three movable guide parts 401a, 401b and 401c of a V-shaped groove, and the movable guide parts 401a, 401b and 401c of the V-shaped groove extend with a predetermined length in the X-axis direction. In addition, the straight-ahead moving plate 401 includes a transmission part 401d which is engaged with the pivot member 119 that will be described later.

On the other hand, a base member 402 also includes three base member guide parts 402a, 402b and 402c of a V-shaped groove which extends with a predetermined length in the X-axis direction, and spherical rolling members (rolling balls) 111a, 111b and 111c which correspond to a rolling part are rotatably interposed between the base member guide parts 402a, 402b and 402c of the V-shaped groove and the movable guide parts 401a, 401b and 401c of the V-shaped groove, which correspond to the base member guide parts, respectively. Incidentally, the shape of the movable guide parts 401a, 401b and 401c and the base member guide parts 402a, 402b and 402c is not limited to the V-shaped groove, and may be another shape as long as the rolling part can be rotatably interposed therebetween.

The straight-ahead moving plate 401 comes in contact with the contact part 101a of the vibration plate 101, and an ellipsoidal motion which is generated in the vibrator 103 is converted into a driving force of the movable part by the friction therebetween. The movable part can move forward and backward in the X-axis direction by the driving force. In the present exemplary embodiment, the base part is formed of the vibrator 103, the elastic member 106, the pressurization plate 105, the vibrator support member 104, the spring retention member 107, the spring 108, the spring keep plate 109 and the base member 402, and the movable part is formed of the straight-ahead moving plate 401.

Hereinafter, the pressurization force which is generated in the pressurization member will be described below. The spring 108 applies the pressurization force to the pressurization plate 105 through the spring retention member 107. The pressurization force further pressurizes the vibrator 103 to the straight-ahead moving plate 401 through the elastic member 106, and the vibrator 103 is biased to the straight-ahead moving plate 401. The contact part 101a of the vibration plate 101 comes in contact with the straight-ahead moving plate 401 in a state of being pressurized against the straight-ahead moving plate. The pressurization force to the straight-ahead moving plate 401 is received by the base member 402 through the rolling part. When voltage is applied to the piezoelectric element 102 under this pressurized contact condition, the resonances in each of the X-axis direction and the Y-axis direction occur in the vibrator 103, and the tip of the contact part 101a causes the ellipsoidal motion. As a result, the movable part can move forward and backward in the X-axis direction.

Figure 10:
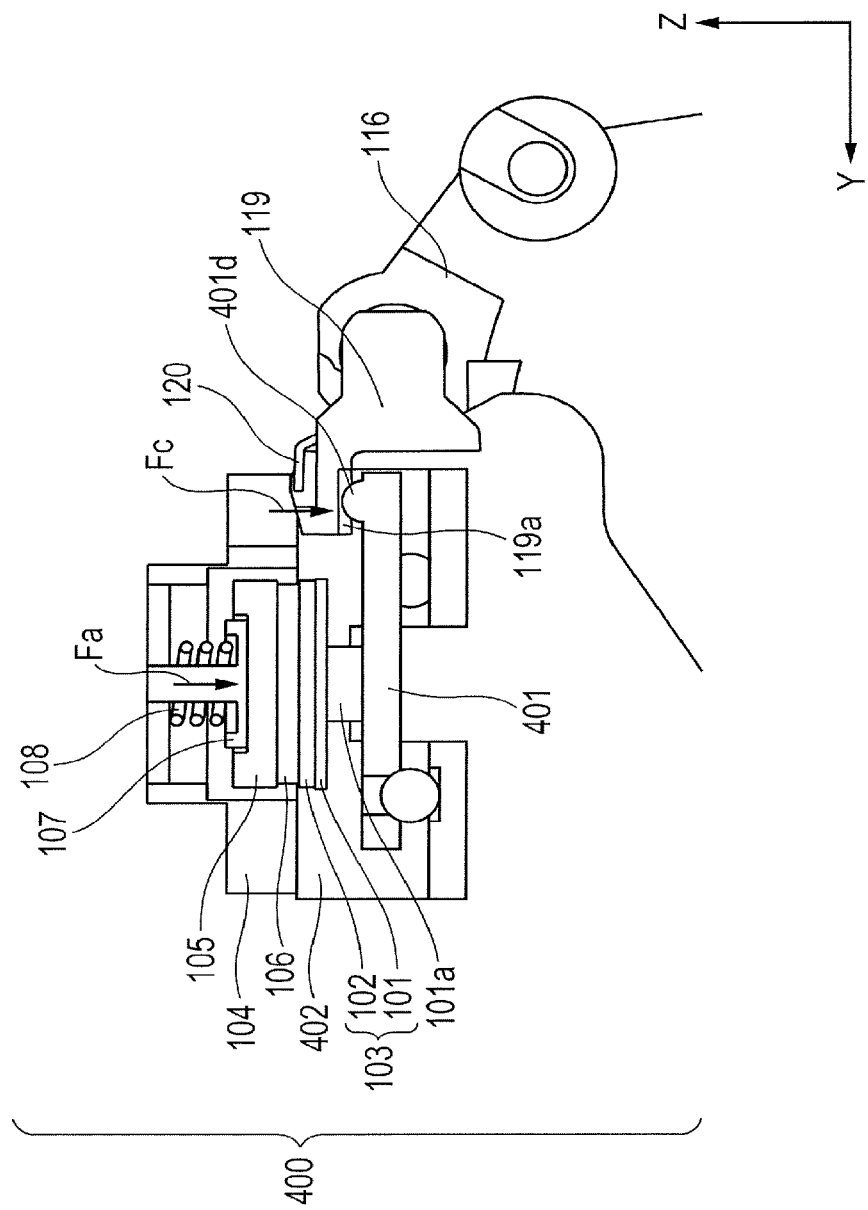
FIG. 10 is a sectional view of an essential part of the linear ultrasonic motor which is the fourth exemplary embodiment of the present invention.

FIG. 10 is a sectional view of an essential part of the linear ultrasonic motor to which the lens retention frame is connected.

In the incorporated state, the engaging part 119a of the V-shaped groove, which is a concave portion provided in the pivot member 119, is incorporated into the linear ultrasonic motor so as to be engaged with the transmission part 401d which is formed integrally with the straight-ahead moving plate 401 and has a spherical convex shape, and the engaging part and the transmission part form a point contact. Incidentally, the shape of the engaging part 119a is not limited to the V-shaped groove, and may be another shape as long as the above described point contact is formed.

In addition, the spring 108 pressurizes the pressurization plate 105 through the spring retention member 107. This pressurization force biases the vibrator 103 against the straight-ahead moving plate 401 through the elastic member 106 (Fa in the figure). Here, when the value of the pressurization force Fa is large, a frictional force generated when the straight-ahead moving plate 401 is driven in the X-axis direction results in being large. However, in the present exemplary embodiment, the rolling part is interposed between the V-shaped grooves, the straight-ahead moving plate 401 is held so as to be guided straight, and there is no sliding part, which reduces a driving loss of the movable part.

In addition, the compressive torsion spring 120 biases the pivot member 119 against the transmission part 401d which is formed integrally with the straight-ahead moving plate 401 (Fc in the figure). The transmission part 401d of the straight-ahead moving plate 401 and the pivot member 119 are held by friction due to this pressurization force, and the driving force of the movable part to the X-axis direction is transmitted to the lens retention frame 116.

In the structure of the present exemplary embodiment, a biasing direction (Fc) of the compressive torsion spring 120 to the transmission part 401d is the same direction as the pressurization force Fa of the spring 108 (that is, the pressurization direction). In other words, the biasing force of the rolling part to the base member 402 becomes a resultant force of Fa and Fc. Because of this, the rattle of the movable part is reduced, and the straight-ahead stability of the movable part to the X-axis direction is enhanced. In other words, both the biasing force Fc due to the compressive torsion spring 120 and the pressurization force Fa against the vibrator 103 have stronger forces in the direction perpendicular to the movable direction than in the movable direction (X-axis direction), and the biasing force Fc due to the compressive torsion spring 120 has a stronger force in the pressurization direction against the vibrator 103 than in the direction perpendicular to the pressurization direction (Z-axis direction).

Up to this point, specific examples concerning the linear ultrasonic motor according to the present invention have been described in detail, but the present invention is not limited to the above described exemplary embodiments, and can have any form as long as the form is described in the scope of the claims.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-076194, filed Apr. 1, 2013, and Japanese Patent Application No. 2014-058095, filed Mar. 20, 2014, which are hereby incorporated by reference herein in their entirety.

What is claimed is:

1. A driving apparatus comprising:
   a vibrator, the vibrator having a piezoelectric element;
   a contact member, the contact member contacting the vibrator;
   a holding part, the holding part holding the vibrator, which is applied, by an elastic member, a pressing force to press the vibrator against the contact member, wherein the contact member and the holding part are able to be relatively moved by an excitation of the piezoelectric element;
   a first transmission member, the first transmission member being movable in association with the relative movement of the contact member and the holding part;
   a first guide part, the first guide part being movable with the vibrator and the first transmission member relative to the contact member;
   a rolling part being rollably held between the first guide part and a second guide part, the second guide part being movable with the contact member relative to the vibrator; and
   a body to be driven, the body to be driven having a second transmission member that is pivotably supported and is movable with the first transmission member in a direction of the relative movement,
   wherein,
   the second transmission member comprises a bias part that abuts on the first transmission member and applies a biasing force of biasing the holding part to the rolling part to the first transmission member, and the rolling part is held by a resultant force of the pressing force or a reaction force of the pressing force, and the biasing force.

2. The driving apparatus according to claim 1, wherein the rolling part and the first transmission member are arranged so as to be arrayed in a direction of the pressing force, when projected onto a plane perpendicular to a movable direction.

3. The driving apparatus according to claim 1, wherein the vibrator has a contact part, and the first transmission member is arranged so as to be arrayed or match with the contact part in a moving direction of the holding part.

4. The driving apparatus according to claim 1, wherein the first transmission member is arranged so as to be arrayed or match with the rolling part in a movable direction.

5. The driving apparatus according to claim 1, wherein the first transmission member has a convex shape, and is engaged with a concave portion provided in the second transmission member.

6. The driving apparatus according to claim 1, wherein the first transmission member has a spherical surface shape formed integrally with the holding part, and comes in point contact with the second transmission member.

7. The driving apparatus according to claim 6, wherein the first transmission member is formed from a hard ball, the hard ball being made of one of ceramic, stainless steel, brass, tungsten carbide and carbon steel.

8. The driving apparatus according to claim 1, wherein the bias part comprises a torsion spring.

9. The driving apparatus according to claim 1, wherein the rolling part is formed of a spherical rolling ball.

10. The driving apparatus according to claim 1, wherein the body to be driven comprises a lens retention frame.

11. A lens apparatus comprising the driving apparatus according to claim 10, and a guide bar, the guide bar guiding the lens retention frame.

12. The lens apparatus according to claim 11, further comprising a steady brace bar, the steady brace bar extending in the same direction as the guide bar and preventing a rotation of the lens retention frame due to the biasing force of the bias part.

13. An image pickup apparatus comprising the lens apparatus according to claim 11.

14. The driving apparatus according to claim 1, wherein the driving apparatus comprises a linear ultrasonic motor in which the piezoelectric element causes an ultrasonic vibration.

15. The driving apparatus according to claim 1, wherein the first transmission member is movable with the holding part.

16. The driving apparatus according to claim 1, wherein the first transmission member is movable with the contact member.

17. The driving apparatus according to claim 1, wherein the rolling part comprises a plurality of ball members,
wherein the direction of the relative movement is an x axis, a direction of the pressing force of the elastic member is a z axis, and
wherein a contact point of the first transmission member and the second transmission member is arranged between the plurality of ball members in a y axis perpendicular to the x axis and the z axis.

18. A driving apparatus comprising:
a vibrator having a piezoelectric element;
a contact member contacting the vibrator;
a holding part holding the vibrator and applying, by a first elastic member, a pressing force to the vibrator to press the vibrator against the contact member, so that a relative movement is caused between the contact member and the holding part when the piezoelectric element vibrates;
a first transmission member movable in association with the relative movement of the contact member and the holding part;
a first guide part which guides the relative movement between the contact member and the holding part along a first direction;
a rolling part being rollably held between the first guide part and a second guide part, wherein the second guide part is arranged along the first direction; and
a body to be driven having a second transmission member that is pivotably supported by the body and is movable, by engaging with the first transmission member, along the first direction,
wherein:
the second transmission member comprises a bias part that abuts on the first transmission member and applies a biasing force to the first transmission member with a second elastic member, and
the rolling part is held by the pressing force or a reaction force of the pressing force, and the biasing force.

19. The driving apparatus according to claim 18, wherein the rolling part and the first transmission member are aligned in a direction of the pressing force, when viewed in the first direction.

20. The driving apparatus according to claim 18, wherein the vibrator has a contact part which contacts with the contact member, and the first transmission member is aligned with the contact part in a direction of the pressing force when viewed in the first direction.

21. The driving apparatus according to claim 18, wherein the first transmission member is aligned with at least one of plural balls comprising the rolling part in a direction of the pressing force when viewed in the first direction.

22. The driving apparatus according to claim 18, wherein the first transmission member has a convex shape, and is engaged with a concave portion provided in the second transmission member.

23. The driving apparatus according to claim 18, wherein the first transmission member has a spherical surface formed integrally with the holding part, and engages with a recess of the second transmission member.

24. The driving apparatus according to claim 23, wherein the first transmission member includes a hard ball made of one of ceramic, stainless steel, brass, tungsten carbide and carbon steel.

25. The driving apparatus according to claim 18, wherein the second elastic member includes a torsion spring.

26. The driving apparatus according to claim 18, wherein the rolling part includes at least one ball.

27. The driving apparatus according to claim 18, wherein the body to be driven comprises a lens retention frame.

28. A lens apparatus comprising the driving apparatus according to claim 27, and a first guide bar for guiding the lens retention frame.

29. The lens apparatus according to claim 28, further comprising a second guide bar extending in the same direction as the first guide bar, for preventing a rotation of the lens retention frame due to the biasing force of the bias part.

30. An image pickup apparatus comprising the lens apparatus according to claim 28.

31. The driving apparatus according to claim 18, further comprising a drive circuit for driving the piezoelectric element to cause an ultrasonic vibration.

32. The driving apparatus according to claim 18, wherein the first transmission member is movable with the holding part.

33. The driving apparatus according to claim 18, wherein the first transmission member is movable with the contact member.

34. The driving apparatus according to claim 18, wherein the rolling part includes two balls which are separately arranged along the first direction,
- wherein a contact point of the first transmission member and the second transmission member is arranged between the two balls.

* * * * *